United States Patent
Hwang et al.

(10) Patent No.: US 9,076,850 B2
(45) Date of Patent: Jul. 7, 2015

(54) HIGH ELECTRON MOBILITY TRANSISTOR

(71) Applicant: Samsung Electronics Co., Ltd., Suwon-Si, Gyeonggi-Do (KR)

(72) Inventors: In-jun Hwang, Hwaseong-si (KR); Hyo-ji Choi, Seoul (KR); Jong-seob Kim, Hwaseong-si (KR); Jae-joon Oh, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 155 days.

(21) Appl. No.: 13/953,165

(22) Filed: Jul. 29, 2013

(65) Prior Publication Data

US 2014/0027779 A1 Jan. 30, 2014

(30) Foreign Application Priority Data

Jul. 30, 2012 (KR) .................... 10-2012-0083510
Feb. 20, 2013 (KR) .................... 10-2013-0018234

(51) Int. Cl.
| H01L 29/66 | (2006.01) |
| H01L 29/778 | (2006.01) |
| H01L 29/36 | (2006.01) |
| H01L 29/423 | (2006.01) |
| H01L 29/06 | (2006.01) |
| H01L 29/20 | (2006.01) |

(52) U.S. Cl.
CPC .............. *H01L 29/778* (2013.01); *H01L 29/36* (2013.01); *H01L 29/42364* (2013.01); *H01L 29/7787* (2013.01); *H01L 29/06* (2013.01); *H01L 29/2003* (2013.01)

(58) Field of Classification Search
CPC ...... H01L 29/7787; H01L 29/36; H01L 29/06
USPC .......................................... 257/194
See application file for complete search history.

(56) References Cited

U.S. PATENT DOCUMENTS

| 7,906,799 B2 | 3/2011 | Sheppard et al. |
| 2005/0082568 A1 | 4/2005 | Hirose et al. |
| 2005/0258451 A1 | 11/2005 | Saxler et al. |

FOREIGN PATENT DOCUMENTS

| JP | 2008-270521 A | 11/2008 |
| JP | 2009-141244 A | 6/2009 |
| JP | 2009-170546 A | 7/2009 |
| JP | 2010-166027 A | 7/2010 |
| JP | 2010-192633 A | 9/2010 |
| KR | 2010-0050527 A | 5/2010 |
| KR | 2010-0097793 A | 9/2010 |
| KR | 2011-0075053 A | 7/2011 |

*Primary Examiner* — Douglas Menz
(74) *Attorney, Agent, or Firm* — Harness, Dickey & Pierce, PLLC

(57) ABSTRACT

According to example embodiments, a high electron mobility transistor includes: a channel layer including a 2-dimensional electron gas (2DEG); a contact layer on the channel layer; a channel supply layer on the contact layer; a gate electrode on a portion of the channel layer; and source and drain electrodes on at least one of the channel layer, the contact layer, and the channel supply layer. The contact layer is configured to form an ohmic contact on the channel layer. The contact layer is n-type doped and contains a Group III-V compound semiconductor. The source electrode and the drain electrode are spaced apart from opposite sides of the gate electrode.

20 Claims, 6 Drawing Sheets

HIGH ELECTRON MOBILITY TRANSISTOR

CROSS-REFERENCE TO RELATED APPLICATIONS

This application claims priority under 35 U.S.C. §119 to Korean Patent Application No. 10-2012-0083510, filed on Jul. 30, 2012, and Korean Patent Application No. 10-2013-0018234, filed on Feb. 20, 2013, in the Korean Intellectual Property Office. The entire disclosure of each of the above-referenced applications is incorporated herein by reference.

BACKGROUND

1. Field

Example embodiments relate to a high electron mobility transistor capable of providing an ohmic contact without using a high temperature process.

2. Description of the Related Art

A nitride semiconductor device can be used as, for example, a power device used to control power. A high electron mobility transistor (HEMT) is an example of one of the power devices. An HEMT includes a channel layer and a channel supply layer formed on the channel layer, and the channel layer includes 2-dimensional electron gas (2DEG) that is used as a carrier. Since the 2DEG is used as a carrier, the electron mobility of the HEMT may be higher than general transistors. The HEMT includes a compound semiconductor with a wide band gap. Thus, a breakdown voltage of the HEMT may be higher than general transistors. The breakdown voltage of the HEMT may increase in proportion to the thickness of a compound semiconductor layer including 2DEG, for example, a GaN layer.

The HEMT may include semiconductor layers having different band gaps. A semiconductor layer of the HEMT with a wider band gap acts as a donor. The 2DEG may be generated in a semiconductor layer with a narrower band gap by the semiconductor layer with the wider band gap. In the HEMT, the 2DEG may be used as a channel.

In addition, a high temperature process may be performed in order to reduce the contact resistance when a source electrode and/or a drain electrode makes ohmic contact with the channel supply layer. However, the other semiconductor layers may be damaged by the high temperature process.

SUMMARY

Example embodiments relate to high electron mobility transistors capable of providing an ohmic contact without using a high temperature process.

Additional aspects will be set forth in part in the description which follows and, in part, will be apparent from the description, or may be learned by practice of example embodiments.

According to example embodiments, a high electron mobility transistor (HEMT) includes: a channel layer including a 2-dimensional electron gas (2DEG); a contact layer on the channel layer; a channel supply layer on the contact layer; a gate electrode on a portion of the channel layer; and a source electrode and a drain electrode on at least one of the channel layer, the contact layer and the channel supply layer. The contact layer is configured to form an ohmic contact on the channel layer. The contact layer is n-type doped. The contact layer contains a Group III-V compound semiconductor. The source electrode and the drain electrode are spaced apart from opposite sides of the gate electrode.

In example embodiments, the channel supply layer, the contact layer, and the channel layer may define a recess, and the gate electrode may be in the recess.

In example embodiments, the HEMT may further include a gate insulating layer on the channel supply layer, and the gate insulating layer may be between the source electrode and the drain electrode.

In example embodiments, an undoped GaN layer may be further between the contact layer and the channel supply layer.

In example embodiments, a thickness of the undoped GaN layer may have a range of 5 to 50 nm.

In example embodiments, a lower surface of at least one of the source electrode and the drain electrode may contact the undoped GaN layer.

In example embodiments, a lower surface of one of the source electrode and the drain electrode may contact the contact layer, and a lower surface of an other of the source electrode and the drain electrode may contact the channel layer.

In example embodiments, lower surfaces of the source electrode and the drain electrode may contact the contact layer.

In example embodiments, the contact layer may be an n-type GaN.

In example embodiments, the channel layer may include one of an undoped GaN layer, InGaN layer, and AlGaN layer.

In example embodiments, the channel supply layer may further include at least one layer of an AlN layer, an AlGaN layer, an AlInN layer, and an AlInGaN layer.

In example embodiments, the channel supply layer may be n-type doped.

In example embodiments, the channel supply layer may include a plurality of layers according to the content of Al or In.

In example embodiments, a buffer layer may be included so the channel layer is on the buffer layer, and the buffer layer may include at least one of a GaN layer, an AlGaN layer, and an AlN layer.

In example embodiments, the channel layer may include one of a p-type GaN layer and a graded AlGaN layer.

In example embodiments, at least one of the source electrode and the drain electrode may contact the contact layer.

In example embodiments, a lower surface of at least one of the source electrode and the drain electrode may contact the channel layer.

In example embodiments, a lower surface of at least one of the source electrode and the drain electrode may contact the contact layer, and a lower surface of an other of the source electrode and the drain electrode may contact the channel layer.

In example embodiments, lower surfaces of the source electrode and the drain electrode may contact the contact layer.

In example embodiments, lower surfaces of the source electrode and the drain electrode may contact the channel supply layer.

Lower surfaces of the source electrode and the drain electrode may be disposed to contact the channel supply layer.

An undoped GaN layer is further disposed between the contact layer and the channel supply layer.

The undoped GaN layer has a thickness in a range of 5 to 50 nm.

A lower surface of at least one of the source electrode and the drain electrode may contact the contact layer, and a lower surface of the other of the source electrode and the drain electrode may contact the undoped GaN layer.

BRIEF DESCRIPTION OF THE DRAWINGS

These and/or other aspects will become apparent and more readily appreciated from the following description of non-limiting embodiments, as illustrated in the accompanying drawings. The drawings are not necessarily to scale, emphasis instead being placed upon illustrating principles of example embodiments. In the drawings.

DETAILED DESCRIPTION

Figure 1:
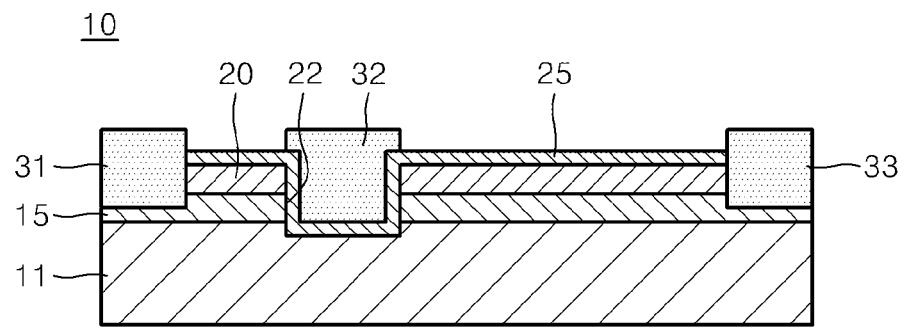
FIG. 1 schematically shows a high electron mobility transistor (HEMT) according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items. Expressions such as "at least one of," when preceding a list of elements, modify the entire list of elements and do not modify the individual elements of the list.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to limit example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as being limited to the particular shapes of regions illustrated herein and are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a high electron mobility transistor (HEMT) will be described in detail with reference to accompanying drawings.

In the drawings, like reference numerals refer to like elements, and the size of each component is exaggerated for convenience and clarity. The embodiment of the present invention is provided to fully describe the present invention, and the embodiments as described below can be modified in various forms.

FIG. 1 schematically shows an HEMT 10 according to example embodiments. The HEMT 10 includes a channel layer 11, a channel supply layer 20 forming a channel in the channel layer 11, a contact layer 15 for ohmic contact between the channel layer 11 and the channel supply layer 20. The channel layer 11 may be a semiconductor layer, for example, an undoped GaN layer, InGaN layer, or AlGaN layer. However, the channel layer 11 is not limited thereto, and may be any non-semiconductor layer in which 2-dimensional electron gas (2DEG) may be generated.

With excellent physical properties, such as wide energy band gap, high thermal chemical stability, and high electron saturation velocity (~3×10⁷ cm/sec), a GaN-based semiconductor may be applied to high-frequency and high-power electronic devices as well as optical devices. Electronic devices using a GaN-based semiconductor may have various characteristics such as a high breakdown field (~3×10⁶ V/cm), a high maximum current density, stable operating characteristics at high temperatures, and high thermal conductivity. Since band-discontinuity between the channel layer and the channel supply layer increases in an HEMT using a GaN-based hetero-junction structure, electrons may be concentrated at a high concentration on the interface of the junction, to improve electron mobility.

The channel supply layer 20 may be an AlN layer, an AlGaN layer, an AlInN layer, an AlGaInN layer, or any combination thereof. In addition, the channel supply layer 20 may be n-type doped. The channel supply layer 20 may include a material having polarization characteristics different from those of the channel layer 11. The channel supply layer 20 may be formed of a material having a band gap wider than that of the channel layer 11. Although FIG. 1 shows a single channel supply layer 20, the channel supply layer 20 may include a plurality of layers. For example, the channel supply layer 20 may include a plurality of layers according to content of Al or In.

A 2DEG layer may be formed in a portion of the channel layer 11. In the channel layer 11, a 2DEG layer may be formed by a spontaneous polarization ($P_{SP}$) and a piezo polarization ($P_{PE}$) due to tensile strain.

The contact layer 15 may be n-type doped as a layer for ohmic contact and may be formed of a Group III-V compound semiconductor. For example, the contact layer 15 may be n-type doped, and include the same material as the channel. For example, the contact layer 15 may be formed as an n-type GaN or n-type InGaN.

In addition, a gate electrode 32 may be formed on a portion of the channel layer 11, and a source electrode 31 and a drain electrode 33 may be formed on both sides of the gate electrode 32. The source electrode 31 and the drain electrode 33 may contact at least one of the channel layer 11, the contact layer 15, and the channel supply layer 20. Here, the contact may refer to at least portions of the source electrode 31 and the drain electrode 33 being contacted.

For example, as illustrated in FIG. 1, lower surfaces of the source electrode 31 and the drain electrode 33 may be in contact with the contact layer 15. The source electrode 31 and the drain electrode 33 are spaced apart from each other. A gate electrode 32 may be formed between the source electrode 31 and the drain electrode 33. The channel supply layer 20 is etched at regions in which the source electrode 31 and the drain electrode 33 will be formed such that the source electrode 31 and the drain electrode 33 contact the contact layer 15. In this regard, as the regions in which the source electrode 31 and the drain electrode 33 will be formed, the channel supply layer 20 and the contact layer 15 may be partially etched. The 2DEG layer formed in the channel layer 11 may be used as a current path (channel) between the source electrode 31 and the drain electrode 33. Since the source electrode 31 and the drain electrode 33 make ohmic contact with the contact layers 15 formed of an n-type Group III-V compound semiconductor, ohmic contact may be obtained without using a high temperature process. Thus, damage to other layers caused by the high temperature process for ohmic contact may be reduced. In addition, since the contact layer 15 is n-type doped, contact resistance may be reduced. For example, if the contact layer 15 is n-type GaN, and the channel supply layer 20 is AlGaN, an n-type GaN/Ti/Al ohmic contact layer may be obtained.

A recess 22 may be formed under the gate electrode 32. The recess 22 may be formed by etching the channel supply layer 20 and the contact layer 15. Alternatively, the recess 22 may be formed by partially etching the channel supply layer 20, the contact layer 15, and the channel layer 11. Then, the gate electrode 32 may be disposed in the recess 22. The 2DEG may be absent in a region corresponding to the recess 22. Also, the region corresponding to the recess may have different characteristics (e.g., electron concentration, or the like) from the remaining region. Via the recess 22, a normally off HEMT may be obtained. A threshold voltage (Vth) of the HEMT may be increased by the recess 22. Thus, in example embodiments, a HEMT may operate in an enhancement mode (E-mode). The E-mode HEMT may be efficiently used to construct various circuits compared with a depletion mode (D-mode) HEMT.

A gate insulating layer 25 may further be disposed on the channel supply layer 20 between the source electrode 31 and the drain electrode 33. The gate insulating layer 25 may be formed along the channel supply layer 20 and the recess 22. The gate insulating layer 25 may include, for example, at least one of $Al_2O_3$, $SiO_x$, $Si_xN_y$, $Sc_2O_3$, AlN, $Ga_2O_3$, $Gd_2O_3$, $Al_xGa_{2\,1-x}O_3$, MgO, and any combination thereof. Although not described herein, any material used to generally form a gate insulating layer used in transistors may also be used to form the gate insulating layer 25. If the gate insulating layer 25 is used, the gate electrode 32 is not required to form Schottky contact with the channel supply layer 20. As a result, the type of materials (conductors) available to form the gate electrode 32 may increase compared to when a Schottky contact is formed between the gate electrode 32 and the channel supply layer 20. In addition, the gate electrode 32, the source electrode 31, and the drain electrode 33 may be formed of the same material.

Figure 2:
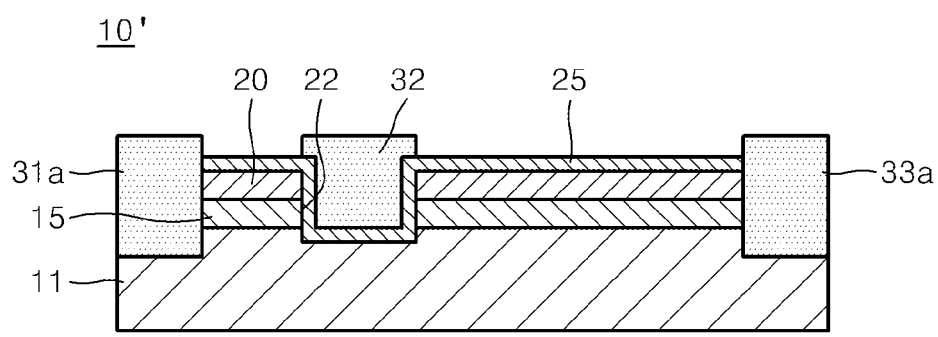
FIGS. 2 through 4 schematically show high electron mobility transistors (HEMTs) according to example embodiments.
Figure 3:
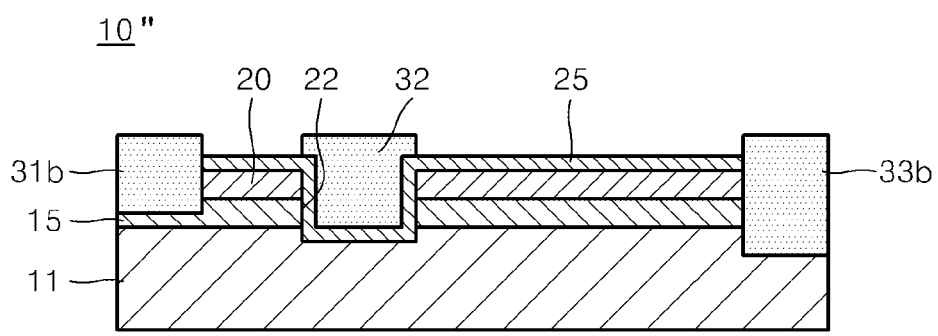
Figure 4:
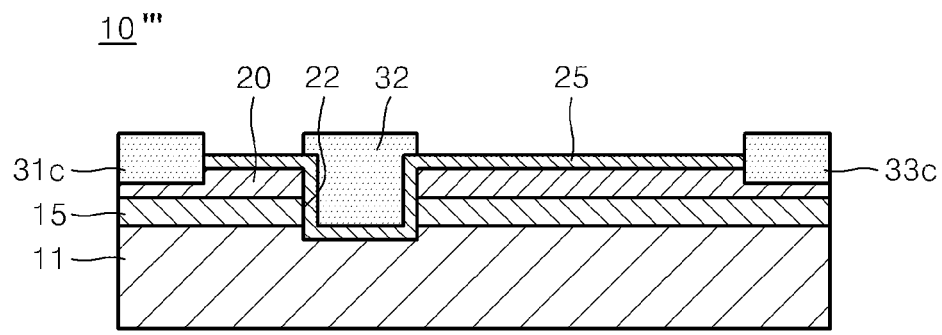

FIGS. 2 through 4 schematically show high electron mobility transistors (HEMTs) according to example embodiments. Hereinafter, differences between FIGS. 1 and 2 through 4 are described.

As illustrated in FIG. 2, in an HEMT 10' according to example embodiments, a lower surface of a source electrode 31a may contact the channel layer 11, and a lower surface of a drain electrode 33a may contact the channel layer 11. Here, a portion of a side portion of the source electrode 31a may contact the contact layer 15, and a portion of a side portion of the drain electrode 33a may contact the contact layer 15.

As illustrated in FIG. 3, in an HEMT 10" according to example embodiments, lower surfaces of a source electrode and a drain electrode may contact different layers. For example, a lower surface of a source electrode 31b may contact the contact layer 15, and a drain electrode 33a may be disposed such that a lower surface thereof contacts the channel layer 11. Alternatively, the lower surface of the source electrode 31b may contact the channel layer 11, and the lower surface of the drain electrode 33b may contact the contact layer 15. Alternatively, the lower surface of one of a source electrode or a drain electrode may contact the channel supply layer 20, and the lower surface of the other of the source electrode and the drain electrode may contact the channel layer 11 or the contact layer 15.

As illustrated in FIG. 4, in an HEMT 10''' according to example embodiments, a lower surface of a source electrode 31c may contact the channel supply layer 20, and a lower surface of the drain electrode 33c may contact the channel supply layer 20. In example embodiments, a may reduce current collapse due to a buffer trap according to arrangement of a source electrode and a drain electrode.

Figure 5:
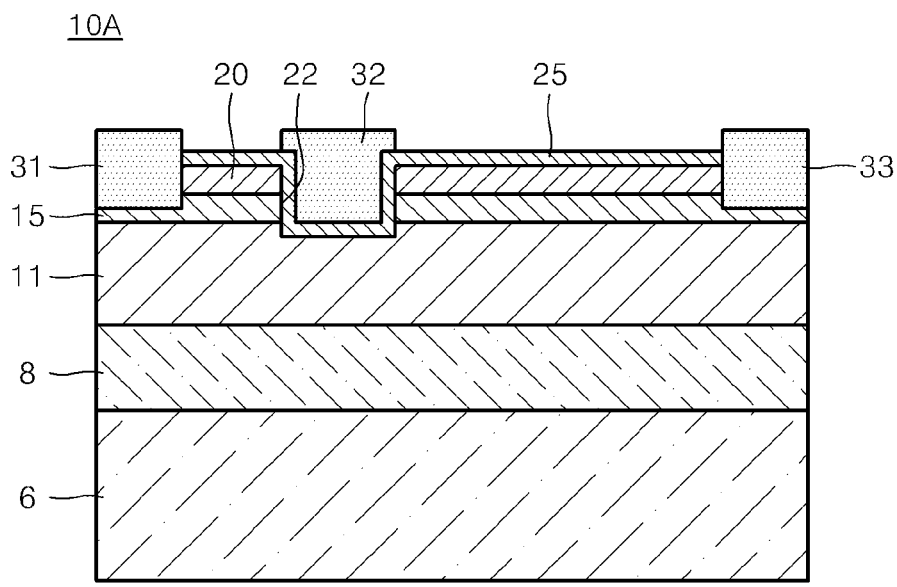
FIG. 5 shows the HEMT of FIG. 1 including a buffer layer and a substrate.

FIG. 5 shows a HEMT 10A according to example embodiments that is the same as the HEMT 10 of FIG. 1, and further includes a substrate 6 and a buffer layer 8. The substrate 6 may be formed of, for example, Si, sapphire, SiC, or GaN. The buffer layer 8 may be provided to mitigate differences of lattice constants and thermal expansion coefficients between the substrate 6 and the channel layer 11 to inhibit degradation of crystallinity of the channel layer 11. The buffer layer 8 may be formed of, for example, AlN, GaN, AlGaN, AlInN, and AlGaInN. The buffer layer 8 may include a single layer or a plurality of layers. If desired, a seed layer (not shown) may further be disposed between the substrate 6 and the buffer layer 8. The seed layer may be a base layer for the growth of the buffer layer 8. The substrate 6 and the buffer layer 8 may be removed after the HEMT is prepared. In other words, the substrate 6 and the buffer layer 8 may be optionally disposed in the HEMT 10A. Additionally, the HEMTs 10' to 10''' described previously in FIGS. 2 to 4 may include a buffer layer 8 and substrate 6 arranged under the channel layer 11 (see FIG. 5).

Figure 6:
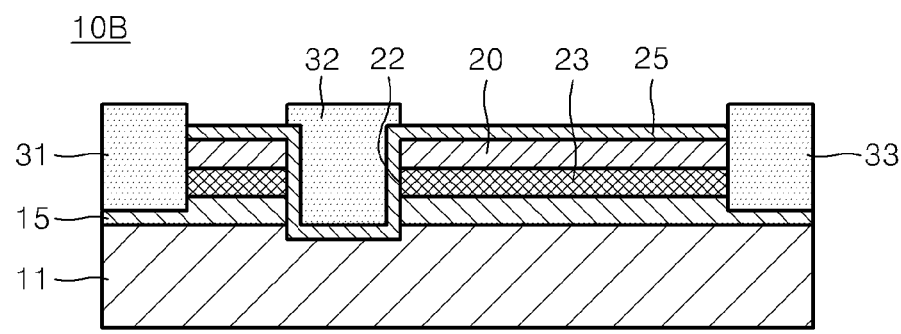
FIG. 6 shows the HEMT of FIG. 1 including an undoped nitride semiconductor layer FIG. 7 schematically shows an HEMT according to example embodiments.

FIG. 6 shows a HEMT 10B according to example embodiments that is the same as the HEMT 10 of FIG. 1 and further includes an undoped nitride semiconductor layer 23. As shown in FIG. 6, the HEMT 10B may include the undoped nitride semiconductor layer 23 between the contact layer 15 and the channel supply layer 25. The undoped nitride semiconductor layer 23 may be disposed between the channel supply layer 20 and the channel layer 11 to improve electron mobility. The undoped nitride semiconductor layer 23 may be formed of, for example, u-GaN, and may have a thickness ranging from 5 to 50 nm. Since the contact layer 15 is n-type doped, the electron mobility may be reduced at an interface with the channel supply layer 20. Thus, the reduction in electron mobility may be compensated for by the undoped nitride semiconductor layer 23, so that the electron mobility may be improved.

Figure 7:
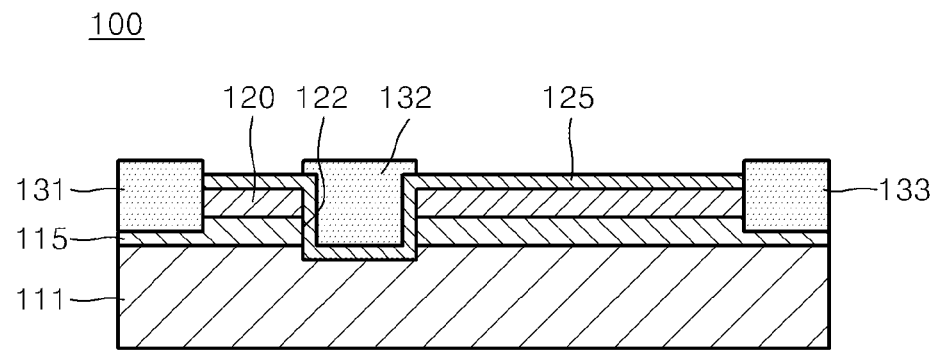

FIG. 7 schematically shows an HEMT 100 according to example embodiments.

As shown in FIG. 7, the HEMT 100 includes a channel layer 111, a channel supply layer 120 forming a channel in the channel layer 111, a contact layer 115 for ohmic contact between the channel layer 111 and the channel supply layer 120. The channel layer 111 may be a p-type doped nitride semiconductor layer or a graded aluminum nitride semiconductor layer. The p-type doped nitride semiconductor layer may be, for example, a p-type GaN layer, and the graded aluminum nitride semiconductor layer may be, for example, a graded-AlGaN (g-AlGaN) layer.

Figure 8:
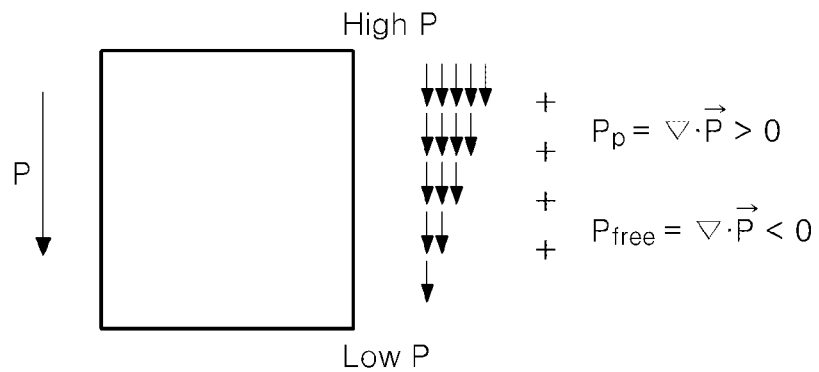
FIGS. 8 to 10 are diagrams for describing a principle of operation of the HEMT of FIG. 7.
Figure 9:
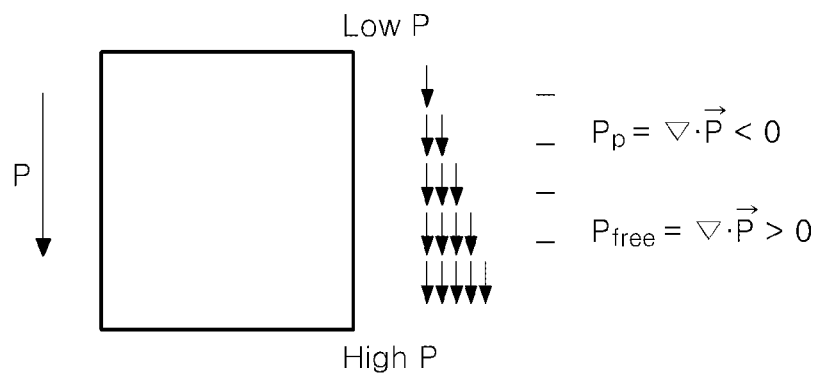
Figure 10:
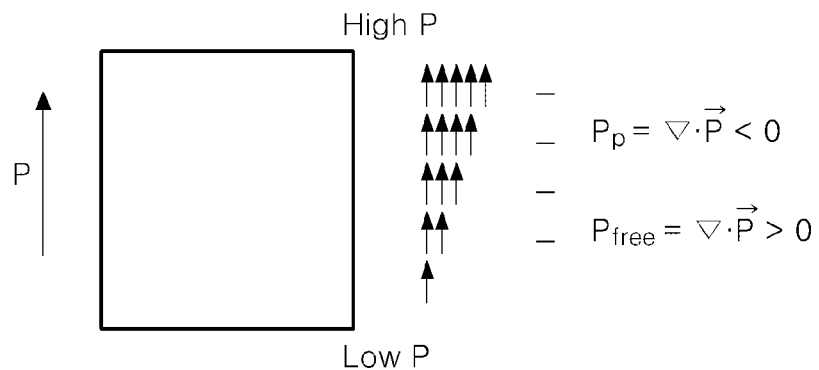

FIGS. 8 to 10 are diagrams for describing a principle of operation of the HEMT of FIG. 7. FIGS. 8 to 10 are diagrams for describing a doping effect via gradual polarization, when a graded aluminum nitride semiconductor layer is used as the channel layer 111.

FIG. 8 shows a polarization density P of the channel layer 111 that increases from a lower surface to an upper surface and the entire polarization direction of the channel layer 111 toward the bottom. In FIG. 8, down arrows at the right side of the channel layer 111 show changes of polarization density in the channel layer 111. Although the changes of the polarization density are represented by five steps herein, they are provided for illustrative convenience. The changes of the polarization density may be continuous with respect to the thickness of the channel layer 111. The polarization density P of a region where more down arrows are shown is higher than that where less down arrows are shown. This also applies to FIGS. 9 and 10. As the polarization density P decreases toward the lower surface from the upper surface of the channel layer 111, a positive (+) polarization charge is formed inside the channel layer 111. In order to offset the positive (+) polarization charge, a negative (−) charge, e.g., free electrons, may be generated in the channel layer 111. Thus, in FIG. 8, the channel layer 111 has an n-doping effect. In the formula shown in FIG. 8, $\rho_p$ refers to a density of polarization charge in the channel layer 111, and $\rho_{free}$ refers to a density of free electrons generated in the channel layer 111.

FIG. 9 shows a polarization density P of the channel layer 111 that increases from an upper surface to a lower surface and the entire polarization direction of the channel layer 111 toward the bottom. In FIG. 9, down arrows at the right side of the channel layer 111 show changes of polarization density in the channel layer 111. As the polarization density P increases toward the lower surface from the upper surface of the channel layer 111, a negative (−) polarization charge is formed inside the channel layer 111. In order to offset the negative (−) polarization charge, a positive (+) charge may be generated in the channel layer 111. Thus, in FIG. 9, the channel layer 111 has a p-doping effect. In the formula shown in FIG. 9, $\rho_p$ refers to a density of polarization charge in the channel layer 111, and $\rho_{free}$ refers to a density of a positive charge generated in the channel layer 111.

FIG. 10 shows a polarization density P slope when the upper surface of the channel layer 111 has an N-face. FIG. 10 shows a polarization density P that increases from a lower surface to an upper surface and the entire polarization direction of the channel layer 111 toward the top. In FIG. 10, up arrows at the right side of the channel layer 111 show changes of polarization density in the channel layer 111 with respect to the channel layer 111. As the polarization density P increases toward the upper surface from the lower surface of the channel layer 111, a negative (−) polarization charge is formed inside the channel layer 111. In order to offset the negative (−) polarization charge, a positive (+) charge may be generated in the channel layer 111. Thus, in FIG. 10, the channel layer 111 also has a p-doping effect. In the formula shown in FIG. 10, $\rho_p$ refers to a density of polarization charge in the channel layer 111, and $\rho_{free}$ refers to a density of positive charges generated in the channel layer 111.

The channel supply layer 120 may be an AlN layer, an AlGaN layer, an AlInN layer, an AlGaInN layer, or any combination thereof. In addition, the channel supply layer 120 may be n-type doped.

The contact layer 115 may be n-type doped as a layer for ohmic contact and may be formed of a Group III-V compound semiconductor. For example, the contact layer 15 may be formed of an n-type GaN.

In addition, a gate electrode 132 may be formed on a portion of the channel layer 111, and a source electrode 131 and a drain electrode 133 may be disposed on two sides of the gate electrode 132. The source electrode 131 and the drain electrode 133 may each contact at least one of the channel layer 111, the contact layer 115, and the channel supply layer 120. Here, the contact may refer to at least portions of a source electrode and a drain electrode being contacted.

For example, as illustrated in FIG. 7, lower surfaces of the source electrode 131 and the drain electrode 133 may contact the contact layer 115. However, the arrangement of the source electrode 131 and the drain electrode 133 is not limited thereto. For example, lower surfaces of the source electrode 131 and the drain electrode 133 may contact the same layer. The lower surfaces of the source electrode 131 and the drain electrode 133 may contact the channel layer 111 or the channel supply layer 120. Alternatively, the lower surfaces of the source electrode 131 and the drain electrode 133 may contact different layers. For example, a lower surface of one of the source electrode 131 and the drain electrode 120 may contact the channel layer 111, and a lower surface of the other of the source electrode 131 and the drain electrode 133 may contact the contact layer 115. Alternatively, a lower surface of one of the source electrode 131 and the drain electrode 133 may be disposed on a lower surface of the channel supply layer 120, and a lower surface of the other of the source electrode 131 and the drain electrode 133 may contact the contact layer 115.

The source electrode 131 and the drain electrode 133 are spaced apart from each other. A gate electrode 132 may be formed between the source electrode 131 and the drain electrode 133. The channel supply layer 120 is etched at regions in which the source electrode 131 and the drain electrode 133 will be formed such that the source electrode 131 and the drain electrode 133 contact the contact layer 115. In this regard, as the regions in which the source electrode 31 and the drain electrode 33 will be formed, the channel supply layer 120 and the contact layer 115 may be partially etched. Since the source electrode 131 and the drain electrode 133 make ohmic contact with the contact layer 115 formed of an n-type Group 111-V compound semiconductor, ohmic contact may be obtained without using a high temperature process. Thus, damage to other layers caused by the high temperature process for ohmic contact may be reduced. In addition, since the contact layer 115 is n-type doped, contact resistance may be reduced.

A recess 122 may be formed under the gate electrode 132. The recess 122 may be formed by etching the channel supply layer 120 and the contact layer 115. Alternatively, the recess 122 may be formed by partially etching the channel supply layer 120, the contact layer 115, and the channel layer 111. Then, the gate electrode 132 may be disposed in the recess 122.

A gate insulating layer 125 may further be disposed on the channel supply layer 120 between the source electrode 131 and the drain electrode 133. The gate insulating layer 125 may be formed along the channel supply layer 120 and the recess 122. The gate insulating layer 125 may include, for example, at least one of $Al_2O_3$, $SiO_x$, $Si_xN_y$, $Sc_2O_3$, AlN, $Ga_2O_3$, $Gd_2O_3$, $Al_xGa_{2\,1-x}O_3$, MgO, and any combination thereof.

Figure 11:
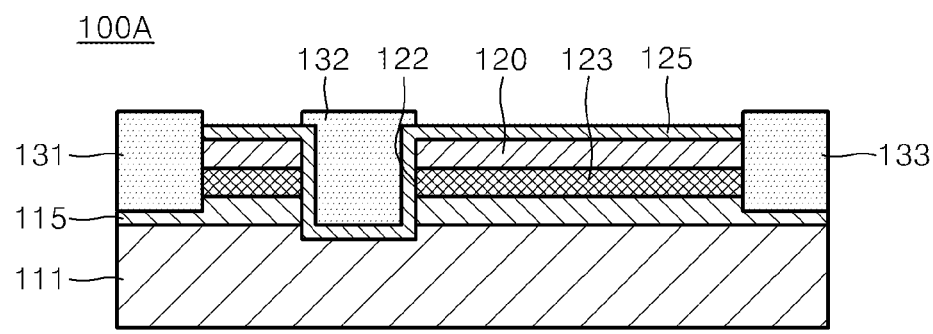
FIG. 11 shows the HEMT of FIG. 7 including an undoped nitride semiconductor layer.

FIG. 11 shows a HEMT 100A according to example embodiments that is the same as the HEMT 100 of FIG. 7, except the HEMT 100A further includes an undoped nitride semiconductor layer 123. The HEMT 100A may include the undoped nitride semiconductor layer 123 between the contact layer 115 and the channel supply layer 125. The undoped nitride semiconductor layer 123 may be disposed between the channel supply layer 120 and the channel layer 111 to improve electron mobility. For example, the undoped nitride semiconductor layer 123 may have a thickness ranging from 5 to 50 nm. Since the contact layer 115 is n-type doped, the electron mobility may be reduced at an interface with the channel supply layer 120. Thus, the reduction in electron mobility may be compensated for by the undoped nitride semiconductor layer 123, so that the electron mobility may be improved.

Figure 12:
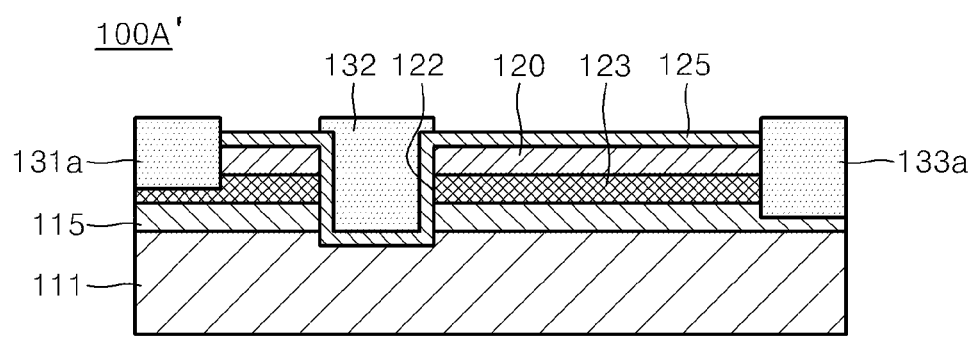
FIGS. 12 through 14 schematically show high electron mobility transistors (HEMTs) according to example embodiments.
Figure 14:
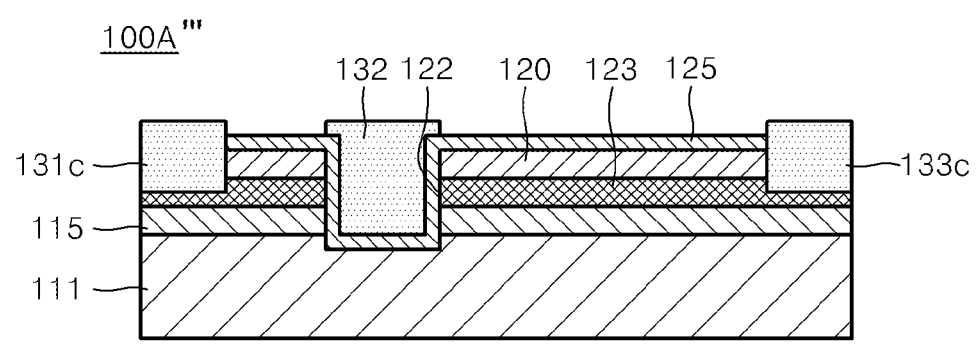

Next, FIGS. 12 and 14 schematically show high electron mobility transistors (HEMTs) according to example embodiments.

As illustrated in FIG. 12, a lower surface of a source electrode 131a may contact the undoped nitride semiconductor layer 123, and a drain electrode 133a may be disposed on the contact layer 115. Alternatively, the lower surface of the source electrode 131a may be disposed on the contact layer 115, and the drain electrode 133a may contact the undoped nitride semiconductor layer 123.

Figure 13:
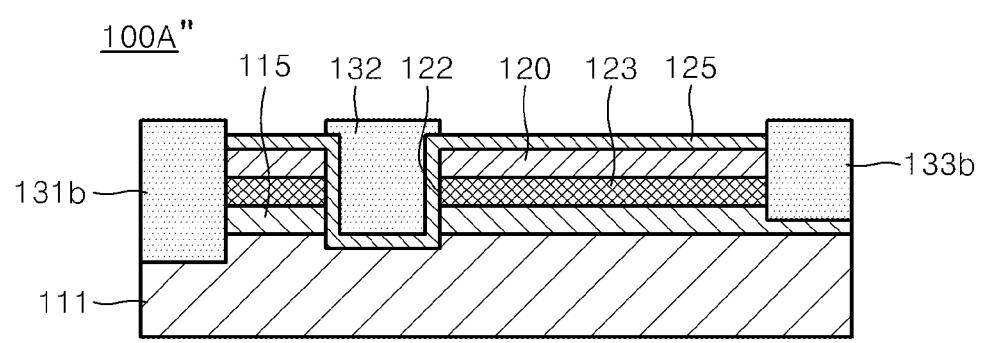

Alternatively, as illustrated in FIG. 13, a lower surface of a source electrode 131b may be disposed to contact the channel layer 111, and a lower surface of a drain electrode 133b may be disposed to contact the contact layer 115. Alternatively, the lower surface of the source electrode 131b may be disposed to contact the contact layer 115, and the lower surface of the drain electrode 133b may be disposed to contact the channel layer 111.

By disposing the source electrode 131b to be in contact with the channel layer 111, the HEMT 200 may include a reverse diode structure. Thus, although a reverse diode is not separately formed, the reverse diode may be realized in a single HEMT. In addition, the drain electrode 133b may make ohmic contact with the contact layer 215 at an intermediate temperature.

For example, as illustrated in FIG. 14, a lower surface of a source electrode 131c may contact the undoped nitride semiconductor layer 123, and a lower surface of a drain electrode 133c may contact the undoped nitride semiconductor layer 123. While not shown in FIG. 14, the lower surface of the source electrode 131c may contact the channel layer 111, and the lower surface of the drain electrode 133c may contact the channel layer 111. According to the HEMT of the current embodiment of the present invention, current collapse due to a buffer trap may be reduced according to the arrangement of a source electrode and a drain electrode. As the operating principle of the HEMT is described above with reference to FIG. 1, a detailed description thereof will not be provided here.

It should be understood that the example embodiments described herein should be considered in a descriptive sense only and not for purposes of limitation. Descriptions of features or aspects within each device according to example embodiments should typically be considered as available for other similar features or aspects in other devices according to example embodiments.

While some example embodiments have been particularly shown and described, it will be understood by one of ordinary skill in the art that variations in form and detail may be made therein without departing from the spirit and scope of the claims.

What is claimed is:

1. A high electron mobility transistor (HEMT) comprising:
    a channel layer comprising a 2-dimensional electron gas (2DEG);
    a contact layer on the channel layer,
        the contact layer configured to form an ohmic contact on the channel layer,
        the contact layer being n-type doped, and
        the contact layer containing a Group III-V compound semiconductor;
    a channel supply layer on the contact layer;
    a gate electrode on a portion of the channel layer; and
    a source electrode and a drain electrode on at least one of the channel layer, the contact layer, and the channel supply layer,
        the source electrode and the drain electrode being spaced apart from opposite sides of the gate electrode.

2. The HEMT of claim 1, wherein
    the channel supply layer, the contact layer, and the channel layer define a recess, and
    the gate electrode is in the recess.

3. The HEMT of claim 1, further comprising:
    a gate insulating layer on the channel supply layer, wherein the gate insulating layer is between the source electrode and the drain electrode.

4. The HEMT of claim 1, further comprising:
an undoped GaN layer between the contact layer and the channel supply layer.

5. The HEMT of claim 4, wherein a thickness of the undoped GaN layer has a range of 5 to 50 nm.

6. The HEMT of claim 4, wherein a lower surface of at least one of the source electrode and the drain electrode contacts the undoped GaN layer.

7. The HEMT of claim 6, wherein
a lower surface of one of the source electrode and the drain electrode contacts the contact layer, and
a lower surface of an other of the source electrode and the drain electrode contacts the channel layer.

8. The HEMT of claim 6, wherein lower surfaces of the source electrode and the drain electrode contact the contact layer.

9. The HEMT of claim 1, wherein the contact layer is n-type GaN.

10. The HEMT of claim 1, wherein the channel layer includes one of an undoped GaN layer, InGaN layer, and AlGaN layer.

11. The HEMT of claim 1, wherein the channel supply layer comprises at least one of an AlN layer, an AlGaN layer, an AlInN layer, and an AlInGaN layer.

12. The HEMT of claim 11, wherein the channel supply layer is n-type doped.

13. The HEMT of claim 1, wherein
the channel supply layer comprises a plurality of layers according to a content of Al or In.

14. The HEMT of claim 1, further comprising:
a buffer layer, wherein
the buffer layer includes at least one of a GaN layer, an AlGaN layer, and an AlN layer, and
the channel layer is on the buffer layer.

15. The HEMT of claim 1, wherein the channel layer includes one of a p-type GaN layer and a graded AlGaN layer.

16. The HEMT of claim 15, wherein a lower surface of at least one of the source electrode and the drain electrode contacts the channel layer.

17. The HEMT of claim 1, wherein at least one of the source electrode and the drain electrode contacts the contact layer.

18. The HEMT of claim 17, wherein
a lower surface of at least one of the source electrode and the drain electrode contacts the contact layer, and
a lower surface of an other of the source electrode and the drain electrode contacts the channel layer.

19. The HEMT of claim 17, wherein lower surfaces of the source electrode and the drain electrode contact the contact layer.

20. The HEMT of claim 1, wherein lower surfaces of the source electrode and the drain electrode contact the channel supply layer.

* * * * *